(12) United States Patent
Peng

(10) Patent No.: US 8,062,811 B2
(45) Date of Patent: Nov. 22, 2011

(54) MASK FOR MANUFACTURING TFT, TFT, AND MANUFACTURING THEREOF

(75) Inventor: Zhilong Peng, Beijing (CN)

(73) Assignee: Beijing Boe Optoelectronics, Beijing (CN)

( * ) Notice: Subject to any disclaimer, the term of this patent is extended or adjusted under 35 U.S.C. 154(b) by 875 days.

(21) Appl. No.: 12/098,182

(22) Filed: Apr. 4, 2008

(65) Prior Publication Data

US 2008/0296665 A1     Dec. 4, 2008

(30) Foreign Application Priority Data

May 30, 2007   (CN) .......................... 2007 1 0099780

(51) Int. Cl.
  *G03F 1/00*   (2006.01)
(52) U.S. Cl. .......................................................... 430/5

(58) Field of Classification Search .............. 430/5, 311, 430/312, 313, 394; 438/151
See application file for complete search history.

(56) References Cited

U.S. PATENT DOCUMENTS

| | | | |
|---|---|---|---|
| 6,876,428 B2 * | 4/2005 | Kwak et al. | 349/187 |
| 2010/0197086 A1 * | 8/2010 | Lim et al. | 438/158 |

FOREIGN PATENT DOCUMENTS

CN   1655039 A   8/2005

* cited by examiner

*Primary Examiner* — Stephen Rosasco
(74) *Attorney, Agent, or Firm* — Sheridan Ross P.C.

(57) ABSTRACT

A mask comprises a channel region half-exposure mask structure, a drain mask structure, and a source mask structure, wherein the channel region half-exposure mask structure comprises a channel region peripheral half-exposure mask structure, which extends from a portion that corresponds to a channel region of the TFT and is outside the portion. According to the present invention, problems such as a connection of the source/drain and a disconnection of the active layer in the channel region can be effectively prevented.

7 Claims, 4 Drawing Sheets

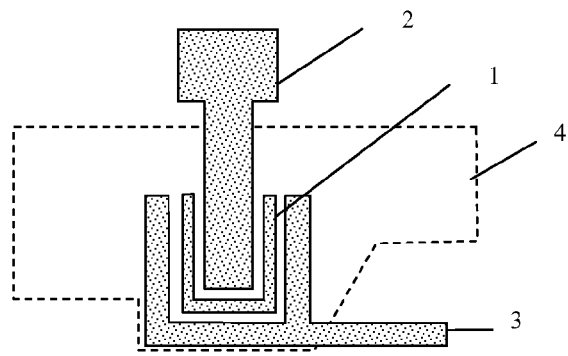
Fig.1 (Prior Art)
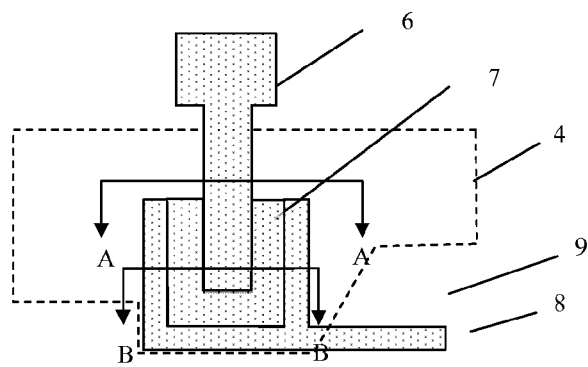
Fig.2 (Prior Art)
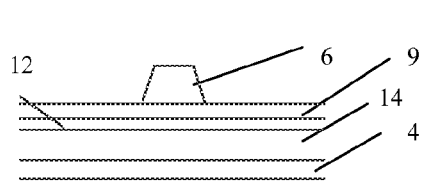      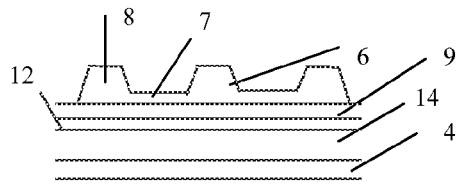
Fig.3A (Prior Art)          Fig.3B (Prior Art)

US 8,062,811 B2

MASK FOR MANUFACTURING TFT, TFT, AND MANUFACTURING THEREOF

FIELD OF THE INVENTION

The present invention relates to a mask for manufacturing a thin film transistor (TFT), a method of manufacturing a TFT by using the mask, and a TFT thus manufactured.

BACKGROUND OF THE INVENTION

In the manufacturing of a thin film transistor-liquid crystal display (TFT-LCD), there is a trend of substituting a 5Mask process with a 4Mask process. The 4Mask process, in which a half-exposure technology is used, has notable advantages of reducing production period and improving yield. However, in the case that the half-exposure technology is utilized for performing exposure of a channel region, problems such as poor channel characteristics may appear during practical production, which are almost inevitable in the 4Mask process. In the 4Mask process, different from the 5Mask process, an active layer and a source/drain layer are exposed at the same time, and the half-exposure technology is performed so as to form a channel region of the active layer. The current half-exposure technology applies a partial light-blocking structure, which is formed as a slit in a grid shape or in a mesh shape, to the channel region mask structure, so as to control the half-exposure of the photoresist on the channel region.

FIG. 1 is a schematic view showing a half-exposure mask for a channel region provided on a gate line and a gate electrode in the conventional technology. As shown in FIG. 1, in order to form the pattern for the channel region of a TFT over the gate line and the gate electrode 4, the half-exposure mask comprises a channel region half-exposure mask structure 1, a drain mask structure 2, and a source mask structure 3.

FIG. 2 is a top view showing the photoresist pattern in the channel region after exposure and development with the half-exposure mask. As shown in FIG. 2, the photoresist pattern in the channel region after exposure and development comprises a drain photoresist 6, the channel region photoresist 7, and the source photoresist 8, which are formed on a source/drain metal layer 9.

FIG. 3A is a cross-sectional view taken along a line A-A in FIG. 2, and FIG. 3B is a cross-sectional view taken along a line B-B in FIG. 2. As shown in FIGS. 3A and 3B, a gate insulting layer 14 is formed on the gate line and the gate electrode 4, an active layer 12 is formed on the gate insulting layer 14, the source/drain metal layer 9 is formed on the active layer 12, and the exposed photoresist pattern is formed on the source/drain metal layer 9. The thickness of the channel region photoresist 7 in the half exposed region is smaller than that in the non-exposed region (corresponding to the drain photoresist 6 and the source photoresist 8), but larger than that in the fully exposed region (corresponding to a portion where the source/drain metal layer 9 is exposed).

FIG. 4 is a top view showing the channel region after etching with a half-exposure mask. As shown in FIG. 4, the channel region after etching comprises an exposed active layer 12 in the channel region, and a pattern of the formed a source 13 and a drain 11.

During practical production, due to the non-uniformity in the thickness of the photoresist and in the half-exposure, as well as the interference between the half exposed portion and the fully exposed portion during exposure, the thickness of the half exposed portion at a boundary region is reduced. Therefore, the processes following the exposure, such as wet etching, dry etching, cleaning, etc., very possibly bring about destruction such as damage or under-etching to a portion of the photoresist in connection with the active layer around the channel region, the source/drain metal electrode, etc. For example, there may be bad characteristics such as a disconnection, as shown FIG. 5. Such destructions certainly destruct the active layer in the channel region in turn, thus adversely influencing the electric characteristics of the pixel. At present, there is still no practical countermeasure thereto during production, and substantial economic loss has been caused.

SUMMARY OF THE INVENTION

In view of the problems such as a disconnection of the channel region during the practical production with the half-exposure process in a 4Mask process, the embodiments of the present invention provide a mask which improves the characteristics of the half exposed channel region to effectively avoid problems such as a connection of the source/drain and a disconnection of the active layer in the channel region.

According to the first aspect of the present invention, there is provided a mask for manufacturing a thin film transistor (TFT), comprising a channel region half-exposure mask structure, a drain mask structure, and a source mask structure. The channel region half-exposure mask structure comprises a channel region peripheral half-exposure mask structure, which extends from a portion that corresponds to a channel region of the TFT and is outside the portion.

According to the second aspect of the present invention, there is provided a thin film transistor (TFT) comprising a channel region. The TFT further comprises a channel region peripheral extension portion which extends from the channel region and is outside the channel region.

According to the third aspect of the present invention, there is provided a method of manufacturing a thin film transistor (TFT) which comprises a channel region and a channel region peripheral extension portion, wherein, after sequentially forming an active layer and a drain/source metal layer on a substrate, a channel region of the TFT are formed by the steps of patterning a photoresist applied on the source/drain metal layer with the above half-exposure mask to form a photoresist pattern; patterning the source/drain metal layer and the active layer with the photoresist pattern as an etching mask; and thinning the photoresist pattern to expose the source/drain metal layer in the channel region and the channel region peripheral extension portion, and removing the source/drain metal layer in the channel region and the channel region peripheral extension portion with the remaining photoresist pattern as an etching mask to expose the active layer in the active area.

In comparison with the conventional technology, the mask according to the embodiments of the present invention can allow an active layer in the channel region to extend outwards after exposure and etching, mainly by means of an extension structure for example in a leaf-like structure and the like of the mask, in which the half exposure mask structure further extends toward the periphery of the channel region. Therefore, the region, which is likely to be damaged, is transferred outwards, thus preserving the integrity of the channel region. At the meantime, it is made relatively easy to control the thickness uniformity of the photoresist and the exposure uniformity during processing, thus efficiently preventing the problems such as a connection of the source/drain and a disconnection of the active layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein:

FIG. 1 is a schematic view showing a half-exposure mask provided in a channel region in a conventional technology;

FIG. 2 is a top view showing the channel region after exposure and development with the half-exposure mask in the conventional technology;

FIG. 3A is a cross-sectional view taken along a line A-A in FIG. 2, and FIG. 3B is a cross-sectional view taken along a line B-B in FIG. 2;

DESCRIPTION OF THE PREFERRED EMBODIMENTS

The mask for manufacturing a thin film (TFT) according to embodiments of the present invention comprises a source/drain mask structure and a channel region mask structure, and the channel region mask structure comprises a channel region peripheral extension mask structure. The material for the mask structures is, for example, an opaque metal such as chromium or other material. The existing mask manufacturing process can be used for manufacturing the mask.

In contrast to the channel region half-exposure mask structure in the conventional technology, in view of the problems such as a disconnection of a channel region in practical production, the embodiments of the present invention provide a new channel region half-exposure mask structure, in which a channel region peripheral extension mask structure is additionally provided. With the channel region peripheral extension mask structure, the defects mentioned above, which may occur during processing, can be transferred to the peripheral region outside the channel region. As a result, the normal electrical characteristics in the channel region are not influenced any more, and problems such as bright spot, non-uniform gray scale, and the like can be avoided.

The First Embodiment

Figure 4:
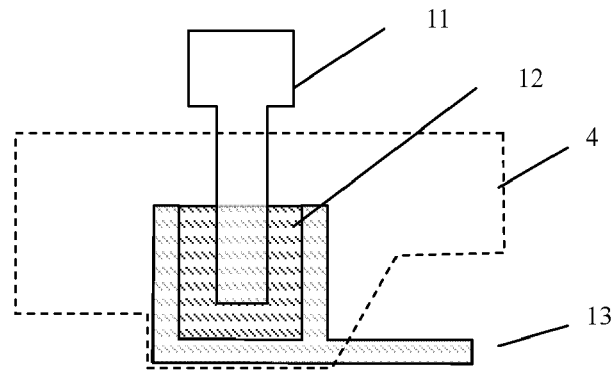
FIG. 4 is a top view showing the channel region after etching with the half-exposure mask in the conventional technology.
Figure 5:
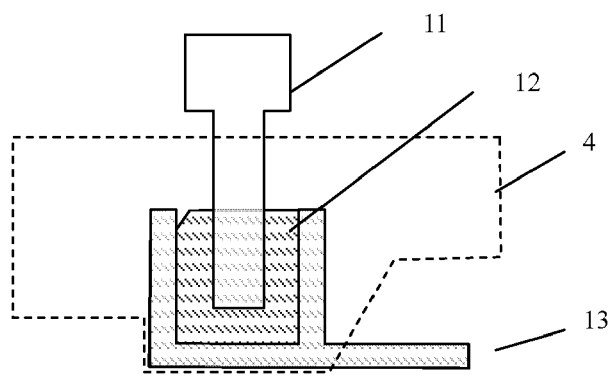
FIG. 5 is a schematic view showing a channel disconnection after etching with the half-exposure mask in the conventional technology.
Figure 6:
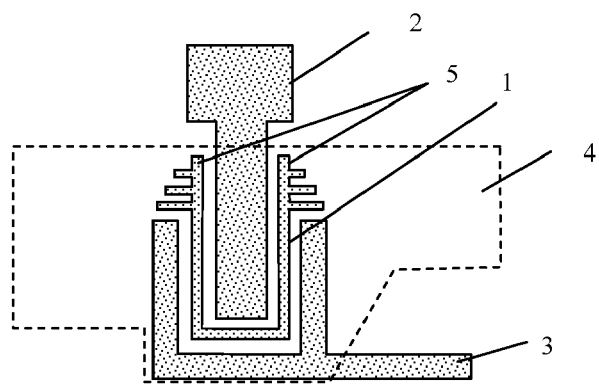
FIG. 6 is a schematic view showing a half-exposure mask provided in the channel region in one embodiment of the present invention.

FIG. 6 is a schematic view showing a half-exposure mask for forming a channel region in a TFT according to one embodiment of the present invention.

As shown in FIG. 6, the mask in this embodiment comprises a channel region half-exposure mask structure 1, a drain mask structure 2, and a source mask structure 3, wherein the channel region half-exposure mask structure 1 further comprises a channel region peripheral half-exposure mask structure 5. The channel region peripheral half-exposure mask structure 5 extends from the channel region and is located a peripheral region adjacent to the channel region. Herein, the channel region is in a "U" shape, the source mask structure 3 comprises a U-shaped portion, and the drain mask structure 2 partially extends into the U-shaped portion of the source mask structure 3.

As shown in FIG. 6, in this embodiment, the channel region peripheral half-exposure mask structure 5 is partially formed or has a portion formed in a grid shape (and can also be in a mesh shape or a pore shape), and is symmetrically arranged at both sides of the drain mask structure 2 in a leaf-like structure. The length of the branches along the lateral direction (perpendicular to the extending direction of the channel) of the structure 5, i.e., the width along the direction perpendicular to the channel region, decreases with the distance away from the channel region.

Figure 7:
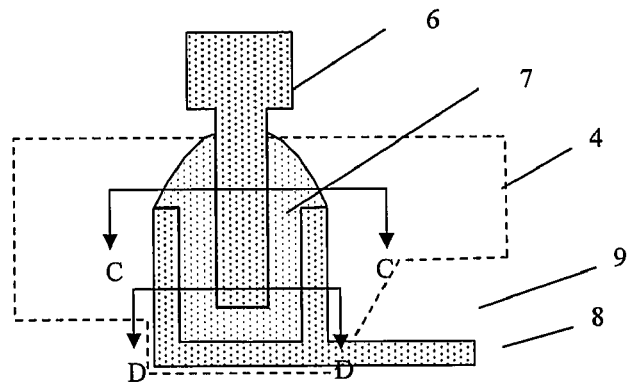
FIG. 7 is a top view showing the channel region after exposure and development with the half-exposure mask in the embodiment of the present invention.
Figure 8A:
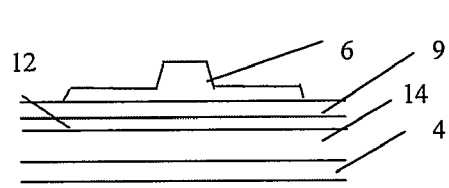
FIG. 8A is a cross-sectional view taken along a line C-C in FIG. 7.

FIG. 7 is a top view showing the channel region after exposure and development with the half-exposure mask; FIG. 8A is a cross-sectional view taken along a line C-C in FIG. 7; and FIG. 8B is a cross-sectional view taken along a line D-D in FIG. 7.

Figure 8B:
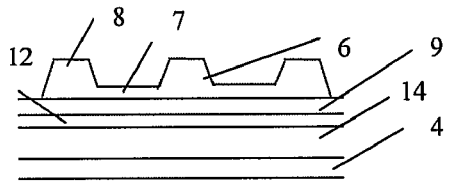
FIG. 8B is a cross-sectional view taken along a line D-D in FIG. 7.

As can be seen from FIGS. 7, 8A, and 8B, in the photoresist layer on the substrate surface, which has been exposed and developed, the thickness of the photoresist 7 in the half exposed region (including the channel region peripheral extension portion) is smaller than that in the non-exposed region (corresponding to the drain photoresist 6 and the source photoresist 8), but larger than that in the fully exposed region (corresponding to a portion which exposes the source/drain metal layer 9).

Figure 9:
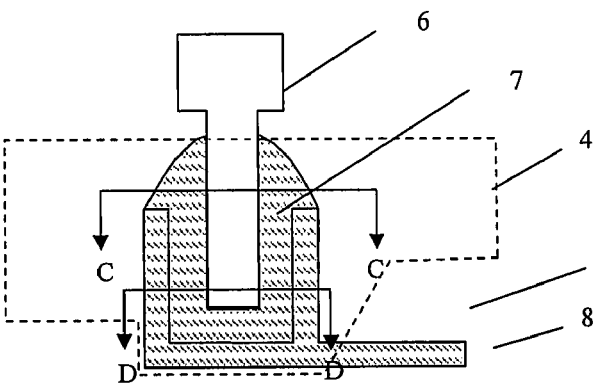
FIG. 9 is a top view showing the channel region after etching with the half-exposure mask in the embodiment of the present invention.

FIG. 9 is a top view showing the channel region after etching with the half-exposure mask. As shown in FIG. 9, the channel region after etching comprises an exposed active layer 12 in the channel region and a pattern of the formed source 13 and the drain 11. It can be seen in the figure that, in comparison with the conventional technology, the active layer 12 in the channel region extends outwards and further comprises a channel region peripheral extension portion outside the channel region. The active layer 12 may comprise a semiconductor layer (e.g., amorphous silicon) and an ohmic layer (e.g., n+ doped amorphous silicon) that are stacked in the order, and the ohmic layer contacts the source/drain metal layer 9.

According to this embodiment, an extension structure in a leaf-like structure and the like is formed in the half exposure portion of the mask, and the half-exposure mask portion extends towards the periphery of the channel region. Therefore, any damages to the active layer in the channel region can be effectively prevented, and it is made relatively easy to control the thickness uniformity of the photoresist and the exposure uniformity during processing. Furthermore, problems such as a connection of the source/drain and a disconnection of the active layer in the channel region can be efficiently prevented, and problems such as bright spot, non-uniform gray scale, and the like can be also be eliminated.

The Second Embodiment

Figure 10:
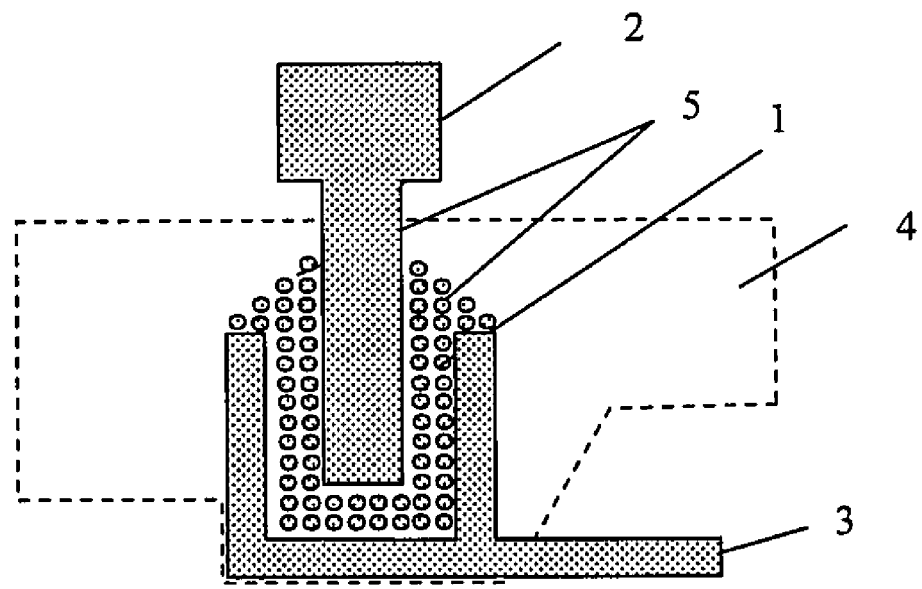
FIG. 10 is a schematic view showing a half-exposure mask provided in the channel region in another embodiment of the present invention.

FIG. 10 is a schematic view showing a half-exposure mask provided in the channel region in another embodiment of the present invention.

As shown in FIG. 10, the mask in this embodiment similarly comprises a channel region half-exposure mask structure 1, a drain mask structure 2, and a source mask structure 3. The channel region half-exposure mask structure 1 further comprises a channel region peripheral half-exposure mask structure 5. This embodiment differs from the first embodiment in that the channel region half-exposure mask structure 1 and the channel region peripheral half-exposure mask structure (i.e., the channel region peripheral extension portion) 5 are both partially in a pore shape or in a mesh shape, and the structure 5 is symmetrically arranged at both sides of the drain mask structure 2. The channel region peripheral half-exposure mask structure 5 extends outwards from the channel region. The half-exposure mask structure has the same effects and functions as that of the first embodiment.

The Third Embodiment

Figure 11:
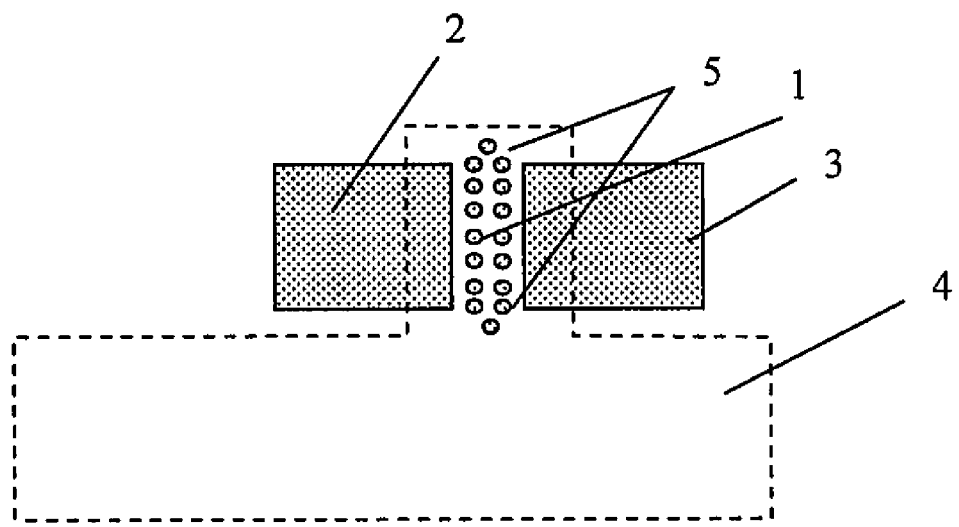
FIG. 11 is a schematic view showing a half-exposure mask provided in the channel region in yet another embodiment of the present invention.

FIG. 11 is a schematic view showing a half-exposure mask provided in the channel region in the third embodiment of the present invention.

As shown in FIG. 11, the mask in this embodiment similarly comprises a channel region half-exposure mask structure 1, a drain mask structure 2, and a source mask structure 3. The channel region half-exposure mask structure 1 further comprises a channel region peripheral half-exposure mask structure 5. This embodiment differs from the first and second embodiments in the shape of the channel region half-exposure mask structure 1 and the channel region peripheral half-exposure mask structure 5. In this embodiment, the channel region half-exposure mask structure 1 is in a shape of line segment, while the channel region peripheral half-exposure mask structure 5 is in a shape of line segment which extends along a direction perpendicular to the channel region. The channel region half-exposure mask structure 1 and the channel region peripheral half-exposure mask structure 5 are both partially in a pore shape or a mesh shape. The channel region peripheral half-exposure mask structure 5 extends outwards from the channel region. The half-exposure mask structure has the same effects and functions as those of the first embodiment.

The embodiments of the present invention also provide a manufacturing method of a TFT with the mask described in the above embodiments, and a TFT thus manufactured.

In an embodiment of the present invention, the manufacturing method comprises depositing sequentially an active layer and a source/drain metal layer on a substrate, and then applying a photoresist to the source/drain metal layer. With the mask in the above embodiments, the photoresist applied onto the channel region for the TFT to be formed is exposed and developed, and a half exposed photoresist pattern is obtained as a etching mask for the channel region of the TFT. The resultant etching mask has a channel region peripheral extension portion. With this etching mask, the source/drain metal layer and the active layer are patterned; then, the photoresist pattern is thinned by, for example, an ashing process to expose the source/drain metal layer in the channel region of the TFT and the peripheral extension portion; and finally, with the remaining photoresist pattern as the etching mask, the source/drain metal layer in the channel region and the peripheral extension portion are removed to expose the active layer in the channel region, thus forming the channel region and the peripheral extension portion of the TFT.

In etching to expose the active layer in the channel region, in the case that the active layer comprises a semiconductor layer and an ohmic layer stacked together, the ohmic layer in the channel region is also removed and only the semiconductor layer is left, that is to say, the active layer in the channel region only comprise the semiconductor layer.

The resulting channel region of the TFT has a channel region peripheral extension portion connected thereto, which is not present in the conventional technology. The width of the channel region peripheral extension portion, along the direction perpendicular to the channel region, decreases with the distance away from the channel region.

All the embodiments presented above are exemplary for the present invention. In fact, in a 4Mask process, all the technical solutions which extend the channel region outwards from the channel region by a structure design of an extension of channel region half-exposure mask structure, are contained in the scope and spirit of the present invention, regardless of the particular structure of the channel region. The active layer can be extended outwards by using different structures of the channel region, so that the channel region can be efficiently protected.

It should be appreciated that the embodiments described above are intended to illustrate but not limit the present invention. Although the present invention has been described in detail herein with reference to the preferred embodiments, it should be understood by those skilled in the art that the present invention can be realized with different material and equipment as necessary, and that various modification and equivalents thereof can be made herein without departing from the spirit and scope of the present invention.

What is claimed is:

1. A mask for manufacturing a thin film transistor (TFT), comprising:
   a channel region half-exposure mask structure, a drain mask structure, and a source mask structure,
   wherein the channel region half-exposure mask structure comprises a channel region peripheral half-exposure mask structure, which extends from a portion that corresponds to a channel region of the TFT and is outside the portion,
   wherein a width of the channel region peripheral half-exposure mask structure, along a direction perpendicular to the channel region, decreases with a distance away from the channel region, and
   wherein the channel region peripheral half-exposure mask structure is a leaf-like structure as a whole.

2. The mask according to claim 1, wherein the channel region peripheral half-exposure mask structure is in a shape selected from the group consisting of a grid shape, a mesh shape, and a pore shape.

3. The mask according to claim 1, wherein the leaf-like structure has a portion in a grid shape.

4. The mask according to claim 1, wherein the leaf-like structure has a portion in a mesh shape.

5. The mask according to claim 1, wherein the leaf-like structure has a portion in a pore shape.

6. The mask according to claim 1, wherein the channel region half-exposure mask structure, the drain mask structure, the source mask structure, and the channel region peripheral half-exposure mask structure are made of chromium.

7. A method of manufacturing a thin film transistor (TFT) which comprises a channel region and a channel region peripheral extension portion, wherein, after forming sequentially an active layer and a drain/source metal layer on a substrate, the channel region and the channel region peripheral extension portion of the TFT are formed by the steps of:
- patterning a photoresist applied on the source/drain metal layer with the half-exposure mask according to claim 1 to form a photoresist pattern;
- patterning the source/drain metal layer and the active layer with the photoresist pattern as an etching mask; and
- thinning the photoresist pattern to expose the source/drain metal layer in the channel region and the channel region peripheral extension portion, and removing the source/drain metal layer in the channel region and the channel region peripheral extension portion with the remaining photoresist pattern as an etching mask to expose the active layer therein in the active layer;
- wherein a width of the channel region peripheral half-exposure mask structure, along a direction perpendicular to the channel region, decreases with a distance away from the channel region, and
- wherein the channel region peripheral half-exposure mask structure is a leaf-like structure as a whole.

\* \* \* \* \*

UNITED STATES PATENT AND TRADEMARK OFFICE
CERTIFICATE OF CORRECTION

| | | |
|---|---|---|
| PATENT NO. | : 8,062,811 B2 | Page 1 of 1 |
| APPLICATION NO. | : 12/098182 | |
| DATED | : November 22, 2011 | |
| INVENTOR(S) | : Zhilong Peng | |

It is certified that error appears in the above-identified patent and that said Letters Patent is hereby corrected as shown below:

On the cover sheet of the patent at item (73), "Beijing Boe Optoelectronics" should read -- Beijing Boe Optoelectronics Technology Co., Ltd. --.

Signed and Sealed this
Sixth Day of March, 2012

David J. Kappos
*Director of the United States Patent and Trademark Office*